US007509226B2

(12) United States Patent
Hops et al.

(10) Patent No.: US 7,509,226 B2
(45) Date of Patent: Mar. 24, 2009

(54) APPARATUS AND METHOD FOR TESTING NON-DETERMINISTIC DEVICE DATA

(75) Inventors: Jonathan M. Hops, Thousand Oaks, CA (US); Brian G. Swing, Los Gatos, CA (US); John R. Pane, Tigard, OR (US); Bruce D. Sudweeks, San Jose, CA (US); Brian C. Phelps, Simi Valley, CA (US); James E. Kinslow, Jr., Ben Lomond, CA (US)

(73) Assignee: Teradyne, Inc., Boston, MA (US)

( * ) Notice: Subject to any disclaimer, the term of this patent is extended or adjusted under 35 U.S.C. 154(b) by 4 days.

(21) Appl. No.: 11/257,773

(22) Filed: Oct. 25, 2005

(65) Prior Publication Data

US 2006/0116840 A1 Jun. 1, 2006

Related U.S. Application Data

(63) Continuation-in-part of application No. 10/606,971, filed on Jun. 25, 2003, now Pat. No. 6,990,423.

(51) Int. Cl.
*G06F 3/00* (2006.01)

(52) U.S. Cl. ........................ 702/117; 702/119; 702/120; 702/182

(58) Field of Classification Search ................. 702/106, 702/117, 124, 155, 182, 187, 183, 119, 120; 370/401; 341/155; 714/732, 718
See application file for complete search history.

(56) References Cited

U.S. PATENT DOCUMENTS

| 5,400,331 | A  | * | 3/1995  | Lucak et al. ............... 370/401 |
| 6,904,375 | B1 | * | 6/2005  | Sabih et al. ................ 702/75  |
| 6,961,871 | B2 | * | 11/2005 | Danialy et al. ............. 714/30  |
| 7,088,276 | B1 | * | 8/2006  | Wegener .................... 341/155 |
| 2003/0050015 | A1 | * | 3/2003 | Kelly et al. ................ 455/67.4 |
| 2004/0005093 | A1 | * | 1/2004 | Rhoads ..................... 382/232 |
| 2004/0107395 | A1 | * | 6/2004 | Volkerink et al. ........... 714/732 |

* cited by examiner

*Primary Examiner*—Eliseo Ramos Feliciano
*Assistant Examiner*—Felix E Suarez
(74) *Attorney, Agent, or Firm*—K&L Gates LLP (57) ABSTRACT

A method and system is provided for detecting and correcting non-deterministic data that provides substantially real-time validation results and maximizes flexibility for the device manufacturer while reducing test costs. The automatic test apparatus and method can correct non-determinism caused by cycle slipping at the beginning of data transmission, between packets of data being transmitted and out-of-order data types of non-determinism. A data validation circuit is coupled to the receiver for validating the packet data based on expected packet data stored in a vector memory.

19 Claims, 8 Drawing Sheets

APPARATUS AND METHOD FOR TESTING NON-DETERMINISTIC DEVICE DATA

CROSS-REFERENCE TO RELATED APPLICATION

This application is a continuation-in-part of U.S. Ser. No. 10/606,971 filed Jun. 25, 2003, now U.S. Pat. No. 6,990,423 issued Jan. 24, 2006, the entire disclosure of which is incorporated by reference herein.

FIELD OF THE INVENTION

The invention relates generally to automatic test equipment, and more particularly to circuits and methods for enabling the testing of non-deterministic semiconductor device data.

BACKGROUND OF THE INVENTION

The testing of semiconductor devices is important to maintain high quality during their manufacture. The automatic test equipment ("ATE") employed to carry out this task comprises sophisticated electronics capable of sending test signals to, and capturing output signals from, one or more devices under test (each, a "DUT"). ATE channel hardware, typically referred to as channels, orchestrate this back and forth flow of signals. These signals flow in the form of packets within a data stream which may be interchangeably referred to as "data packets" or "symbols" within this application.

Figure 1:
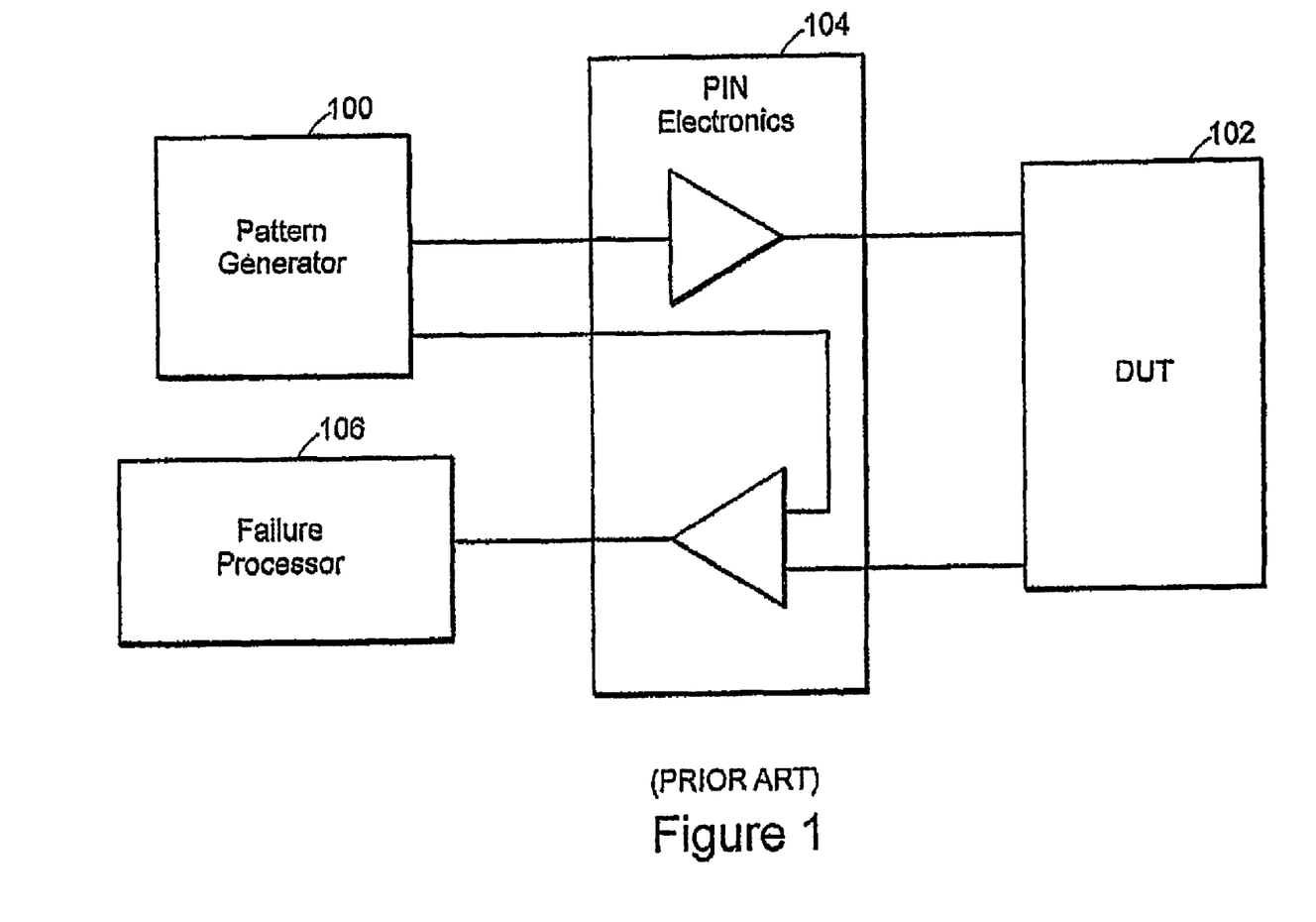
FIG. 1 depicts channel circuitry sending tester data signals originating from a pattern generator to a DUT via interface circuitry commonly referred to as pin electronics as known to the prior art.

FIG. 1 depicts conventional channel circuitry sending tester data signals originating from a pattern generator 100 to a DUT 102 via interface circuitry commonly referred to as pin electronics 104. The pin electronics circuitry 104 includes high-speed differential drivers and receivers to provide a communication interface between the tester and the DUT 102. Preferably, the drivers and receivers have available bandwidths of up to twelve Gbps, with unidirectional differential capabilities. Suitable drivers and receivers include those available from Agere Systems, Allentown, Pa. as models TMOD110, and TRCVO110g.

Response signals from the DUT 102 are captured and compared to expected data with the resulting comparison data transmitted to a failure processor 106 in order to determine whether the DUT 102 passed or failed the test. The expected data from the DUT and the drive data from the generator 100 are typically programmed in the pattern generator vector memory (not shown) to occur at precise times, in accordance with how the DUT 102 should behave. If the data captured from the DUT 102 fails to correspond with expected data, the DUT 102 is considered to have failed that aspect of the test.

Modern semiconductor devices are trending towards employing multiple processing cores on the same chip. Adding to this complexity is the overall trend towards implementing on-chip communication protocols. The end result is an exponential increase in the chip gate count, yet only modest increases in the available pin counts. Consequently, multiple sub-circuits often share the pin-interface.

Figure 2:
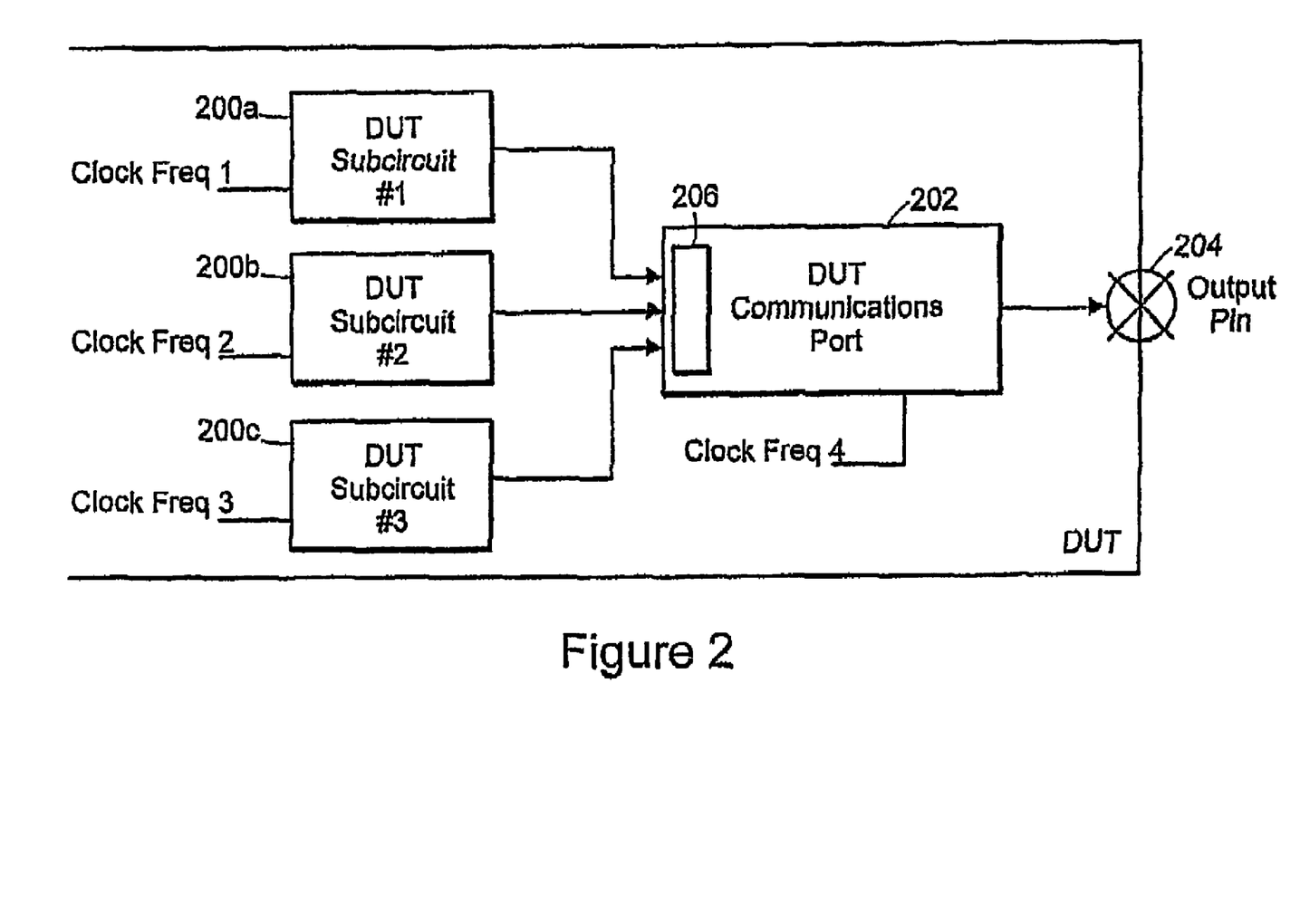
FIG. 2 illustrates generally a block diagram of a shared interface scheme, where a plurality of DUT subcircuits send data packets to a DUT communications port.

FIG. 2 illustrates generally the shared interface scheme, where a plurality of DUT subcircuits (200a-200c, generally 200) send data packets to a DUT communications port 202. The communications port 202 serves as the gatekeeper to accessing the DUT output pin 204. Each of the subcircuits 200 may be clocked by a separate clock having a frequency different from not only the other subcircuits, but also possibly different from the communications port clock. An asynchronous arbitrator 206 handles the sequencing of the data packets to the DUT output pins 204.

Figure 3A:
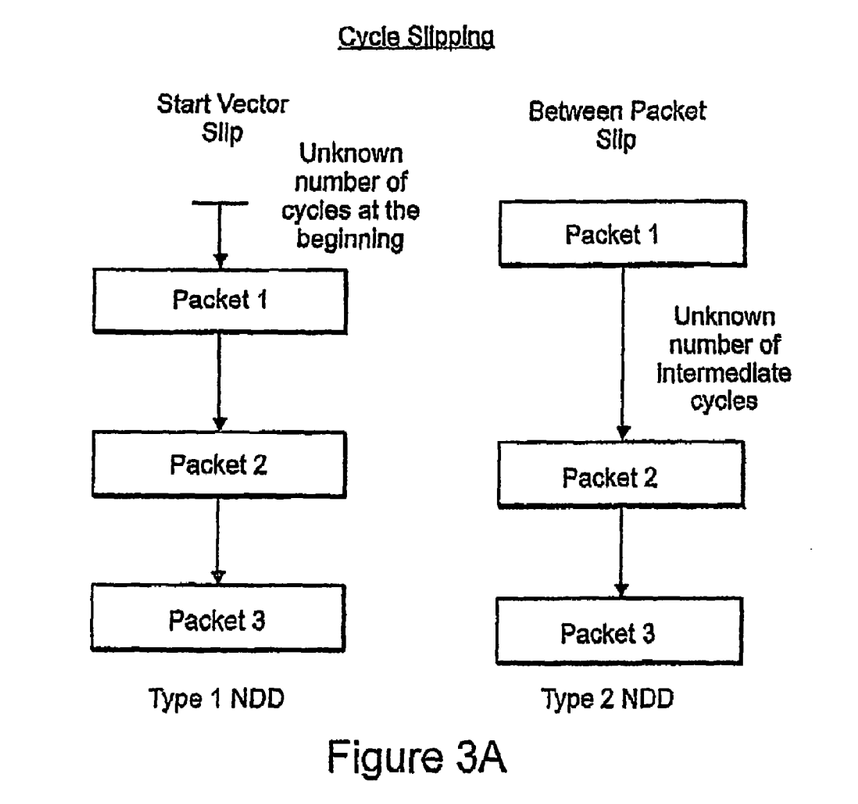
FIGS. 3A and 3B illustrate shared interface errors inherent in the operation of traditional ATEs during evaluation of DUTs.
Figure 3B:
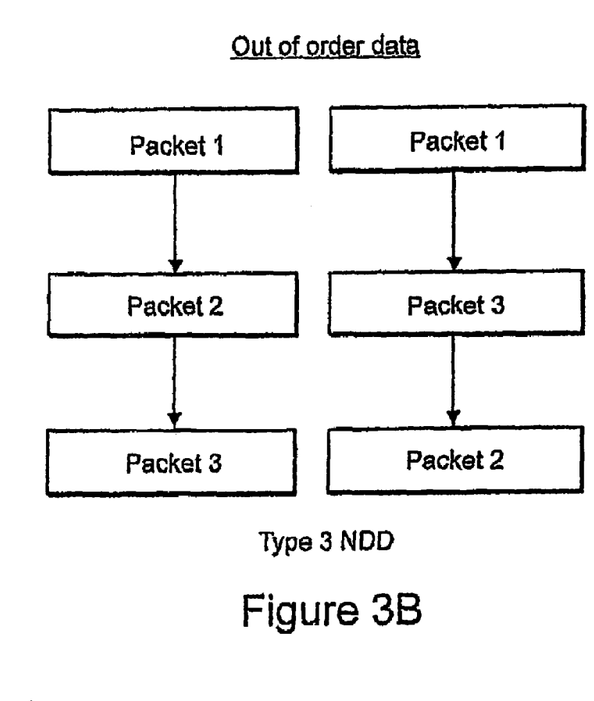

FIGS. 3A and 3B illustrate shared interface problems inherent in the operation of traditional ATEs during evaluation of DUTs 102. These problems are generally characterized as "cycle slipping" and "out-of-order data" errors, and represent three distinct types of non-deterministic data ("NDD"). "Cycle slipping" often results from the communications port clock operating at a frequency different from that of the subcircuit clocks. The result may be that the DUT output pins 204 sees periods of idle data, or a number of cycles of non-packetized information. These idle periods may occur at the beginning of a data transmission (NDD Type 1), or between packets of data (NDD Type 2). In a situation involving cycle-slipping, the actual data may not show up at the originally expected cycle of tester operation, but yet still reflect acceptable device signal behavior.

Out-of-order data (NDD Type 3) often results from the subcircuits attempting to access the communications port 202 (FIG. 2) on the same clock edge, or having differing delays due to environmental conditions. FIG. 3B illustrates the general concept on how an expected sequence may be disturbed into an out-of-order packet sequence.

Two different protocols are used for communication with the DUT 102. These are a high speed serial ("HSS") protocol and a parallel protocol. The challenges presented by HSS protocols are not identical to those presented by parallel protocols. With parallel protocols, it is possible to program a match loop to handle Type 1 NDD. A match loop is a mechanism that prevents the vector data from the generator 100 from advancing until an unexpected data vector occurs. With HSS protocols however, this isn't possible since the idle period of a bus has random synchronization packets inserted. Additionally, a parallel bus spreads all the bits associated with a single byte of a packet across all the data pins of a bus. Real time analysis of the received protocol must take into account all data pins before making any determination on whether that byte was appropriate or not. HSS busses handle the bits differently. Due to the encoding protocol and the serial nature of the bus, each byte is fully contained on a single lane or bus line.

Another challenge unique to HSS protocols is "running disparity non-determinism." In an 8B/10B protocol, each 8-bit byte can be translated into 2 10-bit symbols. One of the goals of the transmitter in the ATE is to keep the number of 1s and 0s balanced in the data stream. Running disparity is the determination of whether more 1s have been transmitted in the last symbol (typically referred to as positive disparity), or more 0s have been transmitted (typically referred to as negative disparity). If the 1s and 0s are balanced, then running disparity remains unchanged. Non-determinism in the area of running disparity can be a side effect of one of the other types of non-determinism. An inserted packet, in the case of Type 3 non-determinism, can change the running disparity of the data as it is transmitted. In such an instance, this would cause functional failures to be identified by the ATE that should really be ignored. Therefore, any solutions for NDD transmissions for serial busses also need to take the running disparity into account.

Both "cycle slipping" and "out of order" data present unique challenges to ATEs. As previously described in the context of FIG. 1, traditional ATE relies on the comparison of expected data, at expected timings, to actual data and actual timings. Providing unknown and unexpected delay and data sequences in the actual DUT data for conventional ATE often results in post-test data descrambling to determine whether the device failed or passed. This may involve substantial modifications to the test program and create overhead in program development and test time.

Thus, a need exists for a system and method of detecting and correcting non-deterministic data that provides substantially real-time validation results and maximizes flexibility for the device manufacturer while reducing test costs.

SUMMARY OF THE INVENTION

In satisfaction of this need, the present invention provides the ability for the ATE to detect and correct non-deterministic data received from a DUT. This ability is available with little impact to the ATE and is protocol independent. With the availability of such a solution, users of the ATE will experience significant test throughput improvements and reduced test costs.

In accordance with one aspect of the invention, a method is provided for testing a semiconductor device. The method includes the steps of receiving a stream of digital data from the device and analyzing the data in real time to find a symbol boundary. Thereafter, two predetermined symbols are identified and the remainder of the stream is matched against a set of expected values in real time to assess whether the device has passed the test.

In accordance with another aspect of the invention, an apparatus is provided for testing a data stream of digital packets from a semiconductor device. The apparatus includes an alignment comparator in electrical communication with the test device, a functional data packet match comparator in electrical communication with the alignment comparator, and a means for storing expected packet data. A symbol map in electrical communication with a signature generator is also included in various other embodiments.

In accordance with a final aspect of the invention, a system for testing a semiconductor device is provided. This system is configured to receive input data packets from the device to analyze them in order to identify a symbol boundary and two predetermined symbols. The rest of the data is then matched against a set of expected values to assess whether the device has passed the test.

BRIEF DESCRIPTION OF THE DRAWINGS

These and other aspects of this invention will be readily apparent from the detailed description below and the appended drawings, which are meant to illustrate and not to limit the invention and in which.

DETAILED DESCRIPTION OF THE PREFERRED EMBODIMENT

The methods and systems for testing semiconductor devices for NDD will now be described with respect to the preferred embodiments. In this description, like numbers refer to similar elements within various embodiments of the present invention.

Generally, the present invention provides a system and method for testing semiconductor devices that generate non-deterministic output packet data which may exhibit cycle-slipping or out-of-order results. Testing is accomplished through the use of automatic test equipment that employ a non-deterministic data validation circuit capable of analyzing the non-deterministic packet data for a real-time determination of data validity. Several aspects of the present invention can also be applied to parallel protocols.

Figure 4:
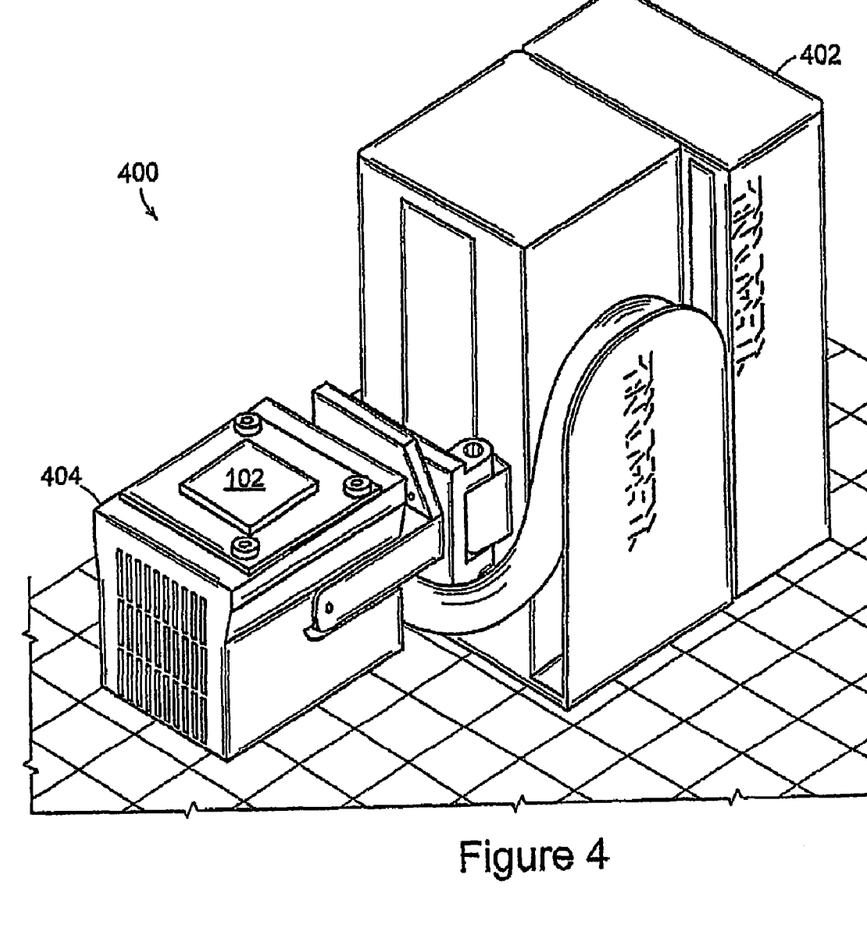
FIG. 4 shows a perspective diagram of automatic test equipment in accordance with one embodiment of the present invention.

FIG. 4 shows the automatic test equipment 400 in accordance with one embodiment of the present invention. The automatic test equipment 400, often referred to as a semiconductor tester includes a main console 402 coupled to a testhead 404 which interfaces with a DUT 102. The testhead 404 houses the various instruments desired by the user to adequately test the DUT 102. The instruments used in testing generally include large circuit boards, or channel cards, that mount within the testhead 404 in order to interface with the DUT 102 in a controlled fashion.

Figure 5A:
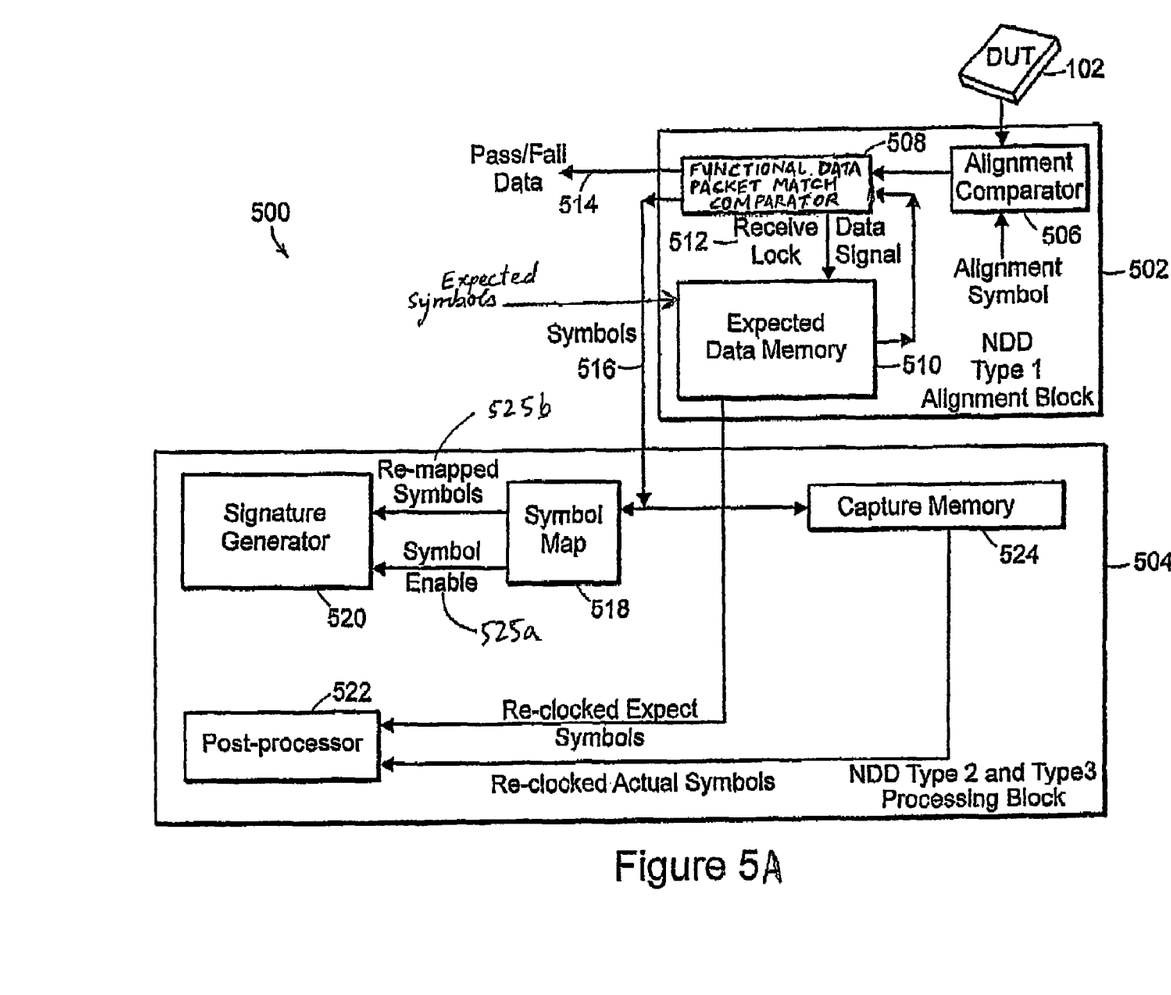
FIG. 5A depicts a data validation circuit in accordance with an embodiment of the present invention.

FIG. 5A depicts a data validation circuit 500 in accordance with an embodiment of the present invention. The data validation circuit includes an NDD Type 1 Alignment Block 502 and an NDD Type 2 and Type 3 Processing Block 504.

The Type 1 Block 502 includes an alignment comparator 506, a functional data packet match comparator 508 and an expected data memory 510. The Type 1 Block 502 further includes data paths for transmitting a receive data lock signal 512 and a pass/fail data signal 514 asserted by the functional data packet match comparator 508.

Considering the components individually, the alignment comparator 506 is configured to receive data from the DUT 102 and scan it for an initial alignment symbol of predetermined length. Identification of the alignment signal is necessary to avoid aliasing.

Figure 5B:
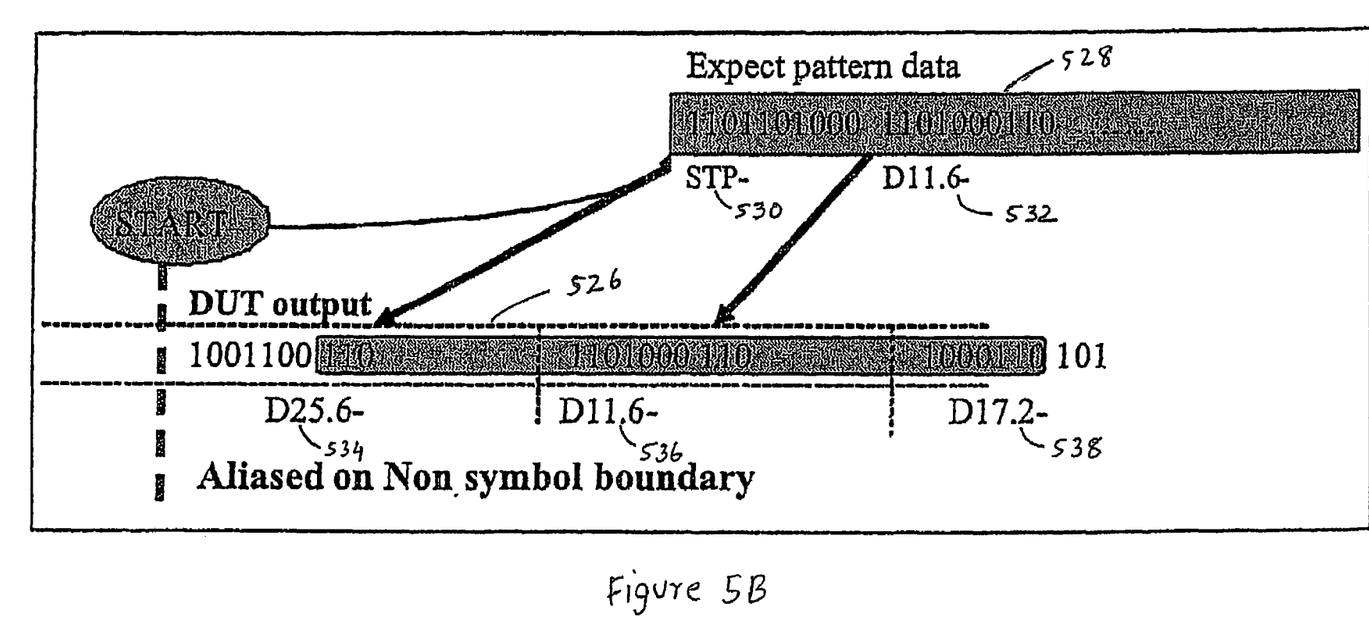
FIG. 5B shows the DUT output being aliased on a non-symbol boundary by symbols in the expected data pattern.

Aliasing is the undesirable or improper matching of a specific sequence due to the sampling of data across a clock boundary during search for a specific word or encoded symbol sequence. For example, FIG. 5B shows the DUT output 526 being aliased across a non-symbol boundary relative to symbols in the expected data pattern 528. In this example, the DUT output 526 is a PCI Express data pattern. The expected symbols in such a pattern are the "STP-" symbol [1101101000] 530, followed by a "D11.6-" symbol [1101000110] 532. However, the DUT 102 is actually transmitting a "D25.6-" symbol [1001100110] 534, a "D11.6-" symbol [1101000110] 536 and a "D17.2-" symbol [1000110101] 538 in that order. If the receiver is not already aligned to the location of the 10-bit boundary, then the STP- symbol 530 followed by a D11.6– symbol 532 sequence can be mistakenly found in the DUT output 526 at a location that is not 10-bit aligned. That is, by reading across the boundary between the $8^{th}$ bit of the D25.6– symbol 534 and the $7^{th}$ bit of the D17.2– symbol 538 one finds the expected symbol.

Accordingly, various embodiments of the claimed invention use two common symbols, namely the "FTS" and "COM", to obtain accurate 10-bit symbol alignment. These symbols do not alias in any combination of 2 other symbols and are very likely to occur during the initial sequence of symbols. Also, although the preferred embodiments employ a 10-bit symbol matching alignment comparator, one skilled in the art will readily recognize that any sequence of predetermined length could be used.

Referring again to FIG. 5A, the functional data packet match comparator 508 analyzes the data stream in order to identify two supplemental data packets of predetermined length such as the FTS and COM. The receive data lock signal 512 is set when these packets are identified. Subsequently, the functional data packet match comparator 508 locks on to the functional starting point of the data stream. In alternate embodiments of the present invention this may be the beginning of real data link layer protocol packets for link configuration or the start of transaction layer protocol packets. The functional data packet match comparator 508 then performs the comparison between actual functional data received from the DUT 102 and expected symbols from the expected data memory 510.

In yet another embodiment of the present invention, the functional data packet match comparator 508 is configured to compare actual data stream symbols with initial expected symbols as well as its opposite disparity. This configuration allows for the correction of running disparity non-determinism. In still yet another embodiment of the present invention, the functional data packet match comparator 508 is not configured to account for the opposite disparity at all.

The expected data memory 510 stores a set of values for comparison with the actual symbols. Test patterns are preferably stored in a vector memory and include cycle-by-cycle information for transmission to the DUT pins, and also the expected cycle-by-cycle data responsive to the applied test signals. Preferably, the circuitry is employed as a field-programmable-gate-array ("FPGA") for high integration at low cost. A pattern generator (not shown) within the ATE generates symbols to be sent to the DUT and also communicates a set of expected symbols to the expected data memory 510.

The receive data lock signal 512 and the pass/fail data signal 514 are status signals asserted by the packet comparator 508 to reflect the current state of the block. The actual symbols from the Type 1 Block 502 are communicated to the Type 2 and Type 3 Block 504 via path 516.

The Type 2 and Type 3 Block 504 preferably includes a symbol map 518, a signature generator 520, a post-processor 522 and a capture memory unit 524. The symbol map 518 is configured as described below to identify and eliminate padding and alignment blocks from the data stream and to output remapped data packets. A symbol enable signal 525a is also provided based upon which the output re-mapped symbols 525b are clocked through the signature generator 520.

Figure 5C:
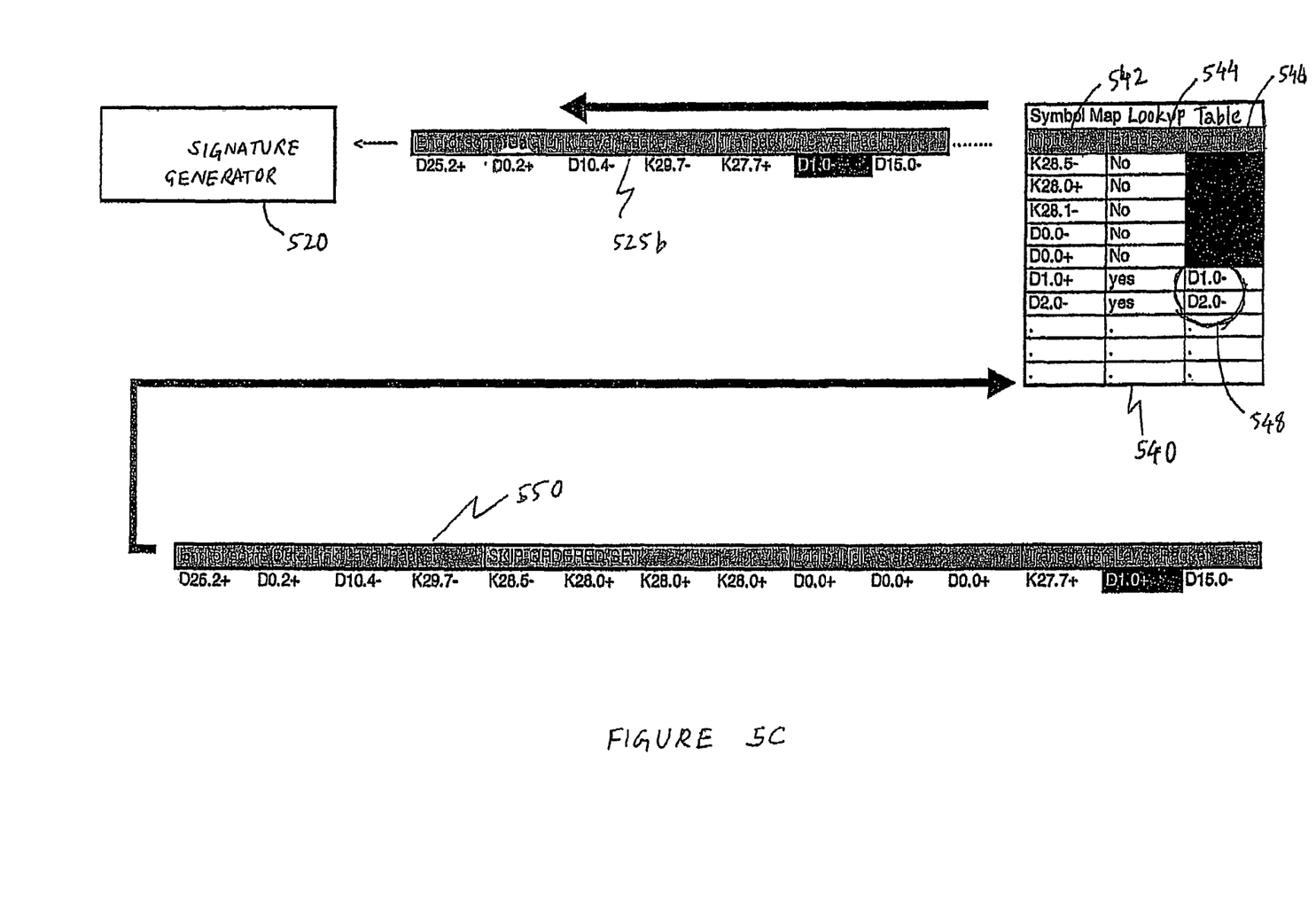
FIG. 5C depicts a symbol map table in accordance with yet another embodiment of the invention.

Referring now to FIG. 5C, a symbol map look-up table 540, which is internal to the symbol map 518, is depicted in accordance with an embodiment of the present invention. This look-up table 540 is used for the purpose of selectively eliminating padding and alignment blocks. The look-up table 540 is further configured to eliminate running disparity non-determinism, described previously. In the look-up table 540, a first column 542 corresponds to a set of symbols that occur in the data stream. A second column 544 corresponds to whether the symbol should be output to the signature generator 520. Finally, a third column 546 is provided to address the problem of running disparity non-determinism. For corresponding "yes" entries in the second column 544, the look-up table 540 produces symbols of the opposite disparity 548.

By way of example, consider the PCI Express data pattern 550. Ten-bit symbols are input to the symbol map look-up table 540. Only if the enable column indicates "yes" will the output 10-Bit symbol be clocked to the signature generator 520. The DUT data in the first column 542 represented by symbols D0.0+, K28.0+, and K28.5− are not enabled in the second column 544 of the look-up table 540, and so they are effectively absent from the output re-mapped symbols 525b that goes to the signature generator 520. Also note that the D1.0+ symbol appearing in the stream for the PCI Express data pattern 550 is mapped to a D1.0− symbol in the third column 546 by the look-up table 540, thus eliminating running disparity non-determinism.

Referring again to FIG. 5A, the signature generator 520 generates a unique identifier based upon the remapped data packets 525b from the symbol map 518. In one embodiment, the signature generator 520 may use a library of pre-calculated identifiers or signatures. The signatures preferably correspond to calculated checksums based on acceptable output sequences for the DUT packet data. For some protocols, the number of acceptable signatures are relatively few, allowing for this kind of pre-calculated data signature validation. A signature generator in various embodiments may take the form of a CRC arithmetic register or a linear feedback shift register.

The post-processor 522 is provided to analyze re-clocked expected and actual data packets for post-process analysis of the data including application of traditional NDD elimination techniques, and optimally to generate signatures for use by the signature generator 520. The capture memory 524 stores the actual set of data packets received from the DUT 102 for further analysis by the post-processor 522.

Figure 6:
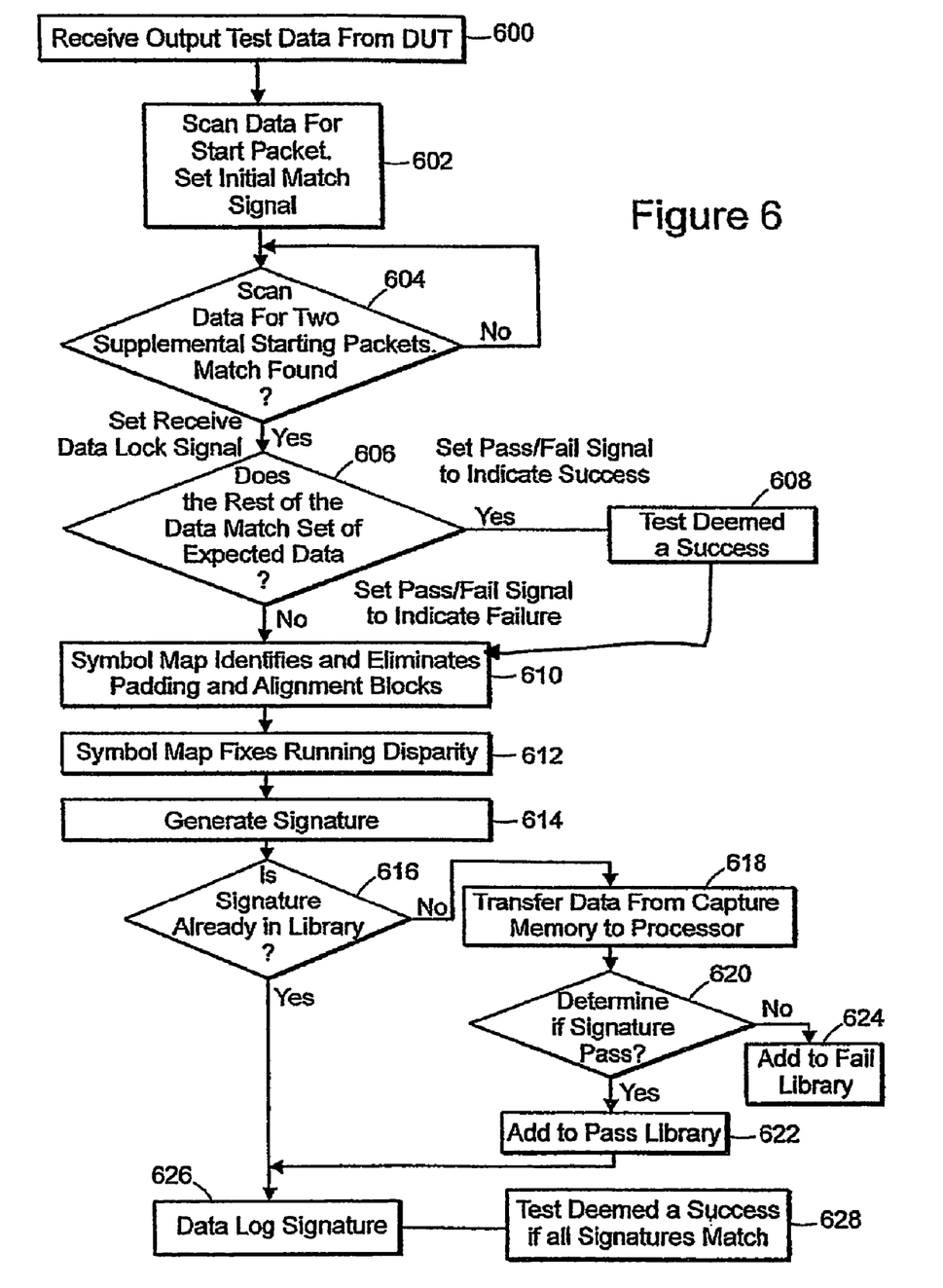
FIG. 6 is a flowchart illustrating a method for validating data, in accordance with an embodiment of the present invention.

FIG. 6 is a flowchart illustrating a method for validating data, in accordance with embodiments of the present invention. As shown, first the data is acquired from the device under test 102 (Step 600). The alignment comparator 506 performs a scan of the input data stream for a starting data packet of predetermined length (Step 602). Once a starting data packet of predetermined length is identified, the functional data packet match comparator 508 begins the analysis of the data stream for two supplemental data packets of predetermined length (Step 604).

Once the two supplemental packets are identified, a data lock signal 512 is set which enables the expected data memory 510 to send data to the packet comparator 508 for analysis of the remainder of the data stream (Step 606). In various embodiments, an 8-bit/10-bit alignment symbol which varies by protocol and is modifiable by the user may be employed. A set of comparators may be employed for the comparison of actual symbols with expected symbols and when all actual data matches the expected set of values, the pass/fail signal 514 is set to indicate a success following which the device is deemed to have passed the test as shown in block 608. If the actual data does not match what is expected, then the DUT 102 is considered to have failed NDD Type 1 testing and the symbols are communicated through data path 516 to the NDD Type 2 and Type 3 Processing Block 504.

The symbol map 518 then proceeds to perform both identification and elimination of padding and alignment data packets (Step 610) as well as fix running disparity non-determinism (Step 612). In various embodiments the symbol map selectively enables or disables the forwarding of symbols to the signature generator 520 and to allow translation of symbols to overcome running disparity non-determinism.

Next, the signature generator 520 calculates a checksum (or signature) from the sequence of actual data 516 received from the DUT 102 (Step 614). This signature is compared to expected signatures stored by the expected data memory 510 or to other expected signatures. The actual data from the DUT is also transmitted to a capture memory 524 to preserve the capability of analyzing the data in-depth following the test using the post-processor 522.

In the preferred embodiment, a signature method for evaluating non-deterministic data for automatic test equipment may also employ an adaptive algorithm for those devices that may provide numerous passing signatures. This adaptive algorithm is illustrated generally as follows. First the device is tested to generate a signature (Step 614). A determination is then made as to whether the detected signature from the DUT 102 is already stored in the library (Step 616). If yes, then the signature is data logged, and the DUT is accepted (Step 626). If no, then the actual test data is transferred from the capture memory 524 to another processor (Step 618), to determine whether that sequence of data passed or failed (Step 620). If the data is deemed to have passed, then the corresponding signature is added to the signature pass library (Step 622). If the data indicates the DUT 102 failed, then the failing signature is added to the signature fail library (Step 624).

Those skilled in the art will recognize the many benefits and advantages afforded by the present invention. Of significant importance is the throughput improvement made possible by the data validation circuit to evaluate non-deterministic data in substantially real-time. Further, the circuit is protocol independent, thus serving a wide variety of serial and serial-like ports for semiconductor devices.

While the invention has been particularly shown and described with reference to the preferred embodiments thereof, it will be understood by those skilled in the art that various changes in form and detail may be made therein without departing from the spirit and scope of the invention.

What is claimed is:

1. A method of testing a semiconductor device, comprising the steps of:
   receiving a digital data stream from the semiconductor device;
   analyzing the data stream in real time to identify a symbol boundary;
   subsequent to identifying the symbol boundary, analyzing the data stream in real time in order to identify at least two predetermined symbols, the at least two predetermined symbols do not alias in any combination of two other symbols;
   determining whether or not the semiconductor device has passed a test if the at least two predetermined symbols are identified, and the remainder of the data stream matches a set of expected values; and
   indicating whether or not the semiconductor device has passed the test.

2. The method of claim 1, further comprising the step of generating signatures for the data stream for comparison against expected signatures for the semiconductor device.

3. The method of claim 1 generating further comprising the step of generating signatures for the data stream for comparison against expected signatures for the semiconductor device, wherein the expected signatures include signatures that correspond to a data stream containing out of order data.

4. The method of claim 1, further comprising the step of identifying and eliminating padding and alignment symbols from the data stream.

5. A method of testing a semiconductor device, comprising the steps of:
   receiving a digital data stream from the semiconductor device;
   analyzing the data stream in real time to identify a symbol boundary;
   subsequent to identifying the symbol boundary, analyzing the data stream in real time in order to identify at least two predetermined symbols, the at least two predetermined symbols do not alias in any combination of two other symbols;
   determining whether or not the semiconductor device has passed a test if the at least two predetermined symbols are identified, and the remainder of the data stream matches a set of expected values;
   indicating whether or not the semiconductor device has passed the test; and
   identifying and eliminating padding and alignment symbols from the data stream using a symbol map.

6. The method of claim 5, further comprising the step of correcting running disparity non-determinism in the data stream.

7. The method of claim 5, wherein the symbol map comprises a look up table containing predetermined padding and alignment symbols and is configured to selectively send remapped symbols to a signature generator.

8. A method of testing a semiconductor device, comprising the steps of:
   receiving a digital data stream from the semiconductor device;
   analyzing the data stream in real time to identify a symbol boundary;
   subsequent to analyzing the symbol boundary, analyzing the data stream in real time in order to identify at least two predetermined symbols, the at least two predetermined symbols do not alias in any combination of two other symbols;
   determining whether or not the semiconductor device has passed a test if the at least two predetermined symbols are identified, and the remainder of the data stream matches a set of expected values; and
   indicating whether or not the semiconductor device has passed the test, wherein each symbol comprises ten bits conforming to a predetermined encoding standard.

9. An apparatus configured to test a data stream of digital packets from a semiconductor device under test, comprising:
   an alignment comparator in electrical communication with the semiconductor device under test;
   a functional data packet match comparator in electrical communication with the alignment comparator, wherein the functional data packet match comparator is configured to identify a starting data packet of predetermined length from the data stream and analyze the data stream once the staffing packet has been identified in order to identify at least two supplemental data packets of predetermined length, the at least two supplemental data packets do not alias in any combination of two other data packets; and
   a memory storing expected test data in electrical communication with the functional data packet match comparator.

10. The apparatus of claim 9, wherein the functional data packet match comparator is further configured to compare additional packets from the data stream to those stored in the expected data memory.

11. The apparatus of claim 9 further comprising, a symbol map in electrical communication with the functional data packet match comparator and configured to identify and eliminate padding and alignment packets from the data stream and to output remapped data packets.

12. The apparatus of claim 11, further comprising a signature generator, in electrical communication with the symbol map, configured to generate a unique signature based upon the remapped data packets.

13. A system for testing a semiconductor device, the system comprising:
- a means for receiving a digital data stream from the semiconductor device;
- a means for analyzing the data stream in order to identify a symbol boundary;
- a means for analyzing the data stream in order to identify at least two predetermined symbols, once the symbol boundary has been identified;
- a means for deeming the semiconductor device to have passed the test, if at least two predetermined symbols are identified, the at least two predetermined symbols do not alias in any combination of two other symbols, and a remainder of the data stream matches a set of expected values; and
- a signal indicating whether or not the semiconductor device has passed the test.

14. The system of claim 13 further comprising a means for identifying and eliminating padding and alignment symbols from the data stream, if the semiconductor device is deemed to have not passed the test.

15. The system of claim 14 wherein the means for identifying and eliminating padding and alignment symbols from the data stream uses a symbol map.

16. The system of claim 15 further comprising a means for correcting running disparity in the data stream.

17. The system of claim 15, wherein the symbol map comprises a look up table containing known padding and alignment symbols and is configured to selectively forward remapped symbols to a signature generator.

18. The system of claim 14 further comprising a means for generating signatures for the data stream and compare them against expected signatures for the semiconductor device.

19. The system of claim 13, wherein each symbol conforms to a predetermined encoding standard.

* * * * *